US010290529B2

(12) United States Patent
Hanamachi et al.

(10) Patent No.: US 10,290,529 B2
(45) Date of Patent: May 14, 2019

(54) HEATER UNIT

(71) Applicant: NHK SPRING CO., LTD., Yokohama-shi, Kanagawa (JP)

(72) Inventors: Toshihiko Hanamachi, Isehara (JP); Naoya Aikawa, Isehara (JP)

(73) Assignee: NHK SPRING CO., LTD., Yokohama-shi, Kanagawa (JP)

( * ) Notice: Subject to any disclaimer, the term of this patent is extended or adjusted under 35 U.S.C. 154(b) by 0 days.

(21) Appl. No.: 15/948,473

(22) Filed: Apr. 9, 2018

(65) Prior Publication Data

US 2018/0226285 A1 Aug. 9, 2018

Related U.S. Application Data

(63) Continuation of application No. PCT/JP2016/078575, filed on Sep. 28, 2016.

(30) Foreign Application Priority Data

Oct. 26, 2015 (JP) .................................. 2015-209886

(51) Int. Cl.
*H01L 21/683* (2006.01)
*H01L 21/3065* (2006.01)
(Continued)

(52) U.S. Cl.
CPC .......... *H01L 21/6831* (2013.01); *H01L 21/02* (2013.01); *H01L 21/3065* (2013.01);
(Continued)

(58) Field of Classification Search
CPC ........... H01L 21/6831; H01L 21/67017; H01L 21/67098; H01L 21/02; H01L 21/3065;
(Continued)

(56) References Cited

U.S. PATENT DOCUMENTS

2005/0042881 A1  2/2005  Nishimoto et al.
2006/0027169 A1  2/2006  Tsukamoto et al.
(Continued)

FOREIGN PATENT DOCUMENTS

JP   2002-184557 A   6/2002
JP   2005-033181 A   2/2005
(Continued)

OTHER PUBLICATIONS

English Translation of Written Opinion of the International Searching Authority for corresponding PCT/JP2016/078575 dated Dec. 6, 2016.
(Continued)

*Primary Examiner* — Shawntina T Fuqua
(74) *Attorney, Agent, or Firm* — Hauptman Ham, LLP

(57) ABSTRACT

A heater unit having high in-plane temperature uniformity is provided. A heater unit includes a first heater part, a second heater part controlled independently of the first heater part, a base arranged with a groove in a region between the first heater part and the second heater part, and a cover part arranged at an opening end of the groove and providing a closed space with the groove. In addition, an insulating layer covering the first heater part and the second heater part, and an electrostatic chuck attached to the base via the insulating layer may be further included. In addition, the closed space provided by the cover part and the groove may be a vacuum.

12 Claims, 9 Drawing Sheets

(51) Int. Cl.
| | |
|---|---|
| *H01L 21/02* | (2006.01) |
| *H05B 3/18* | (2006.01) |
| *H05B 3/74* | (2006.01) |
| *H01L 21/67* | (2006.01) |
| *H05B 3/28* | (2006.01) |

(52) U.S. Cl.
CPC .. *H01L 21/67017* (2013.01); *H01L 21/67098* (2013.01); *H01L 21/67103* (2013.01); *H01L 21/683* (2013.01); *H05B 3/18* (2013.01); *H05B 3/28* (2013.01); *H05B 3/74* (2013.01)

(58) Field of Classification Search
CPC ............. H01L 21/683; H01L 21/67109; H01L 21/67248; H01L 21/68785; H05B 3/18; H05B 3/28; H05B 3/74; H01J 37/32724; H01J 37/32715
See application file for complete search history.

(56) References Cited

U.S. PATENT DOCUMENTS

| | | | |
|---|---|---|---|
| 2006/0191482 | A1 | 8/2006 | Kanno et al. |
| 2006/0207725 | A1* | 9/2006 | Oohashi ............ H01J 37/32724 156/345.53 |
| 2008/0170969 | A1 | 7/2008 | Yoshioka et al. |
| 2010/0116788 | A1 | 5/2010 | Singh et al. |
| 2011/0232888 | A1 | 9/2011 | Sasaki |
| 2012/0000612 | A1 | 1/2012 | Odagiri et al. |
| 2013/0270250 | A1 | 10/2013 | Pease et al. |
| 2015/0113826 | A1 | 4/2015 | Odagiri et al. |
| 2016/0276198 | A1 | 9/2016 | Anada et al. |

FOREIGN PATENT DOCUMENTS

| | | |
|---|---|---|
| JP | 2006-024433 A | 1/2006 |
| JP | 2006-216822 A | 8/2006 |
| JP | 2006-261541 A | 9/2006 |
| JP | 2007-067036 A | 3/2007 |
| JP | 2008-177285 A | 7/2008 |
| JP | 2008-251707 A | 10/2008 |
| JP | 2010-141081 A | 6/2010 |
| JP | 2012-015285 A | 1/2012 |
| JP | 2014-072355 A | 4/2014 |
| JP | 2014-209615 A | 11/2014 |
| JP | 2015-520504 A | 7/2015 |
| WO | 2013187192 A1 | 12/2013 |

OTHER PUBLICATIONS

International search report for PCT/JP2016/078575 dated Dec. 6, 2016 with its English Translation.

Written Opinion of the International Searching Authority for PCT/JP2016/078575 dated Dec. 6, 2016.

Taiwanese Office Action dated Oct. 17, 2017 for the corresponding Taiwanese application No. 105133771.

Japanese Office Action dated Jan. 8, 2019 for the corresponding Japanese application No. 2015-209886, with partial English translation.

The extended European search report dated Jan. 25, 2019 for the corresponding European application No. 16859467.9.

* cited by examiner

HEATER UNIT

CROSS REFERENCE TO RELATED APPLICATIONS

This application is a U.S. continuation application filed under 35 U.S.C. § 111(a), of International Application No. PCT/JP2016/078575, filed on Sep. 28, 2016, which claims priority to Japanese Patent Application No. 2015-209886 filed on Oct. 26, 2015, the disclosures of which are incorporated by reference.

FIELD

The present invention is related to a heater unit. In particular, the present invention is related to a heater unit used in a semiconductor manufacturing apparatus.

BACKGROUND

In a manufacturing process of a semiconductor device, functional elements such as a transistor element, wiring, a resistor element, a capacitor element and the like are formed by forming and processing a thin film on a semiconductor substrate. As a method of forming the thin film on the semiconductor substrate, a chemical vapor deposition (CVD) method, a physical vapor deposition (PVD) method, an atomic layer deposition (ALD) or the like are used. In addition, a method such as a reactive ion etching (RIE) method is used as a method of processing the thin film. In addition, in the manufacturing process of the semiconductor device, a surface treatment process such as a plasma treatment or the like are performed in addition to forming and processing the thin film.

A stage for supporting the semiconductor substrate is arranged in the apparatus used for the film formation, processing, and surface treatment steps described above. The stage not only supports the semiconductor substrate but also includes a function for adjusting the temperature of the semiconductor substrate according to each processing step. The stage is arranged with a heating mechanism in order to adjust the temperature as described above. In particular, ceramic heaters (heater units) configured of metal or ceramics are widely used as a heating mechanism in the semiconductor apparatus described above.

In the film formation, processing and surface treatment steps described above, the quality of the thin film, the processed shape and the surface state are sensitively changed depending on the temperature of the substrate. Therefore, a high temperature in-plane uniformity is required for the heater unit described above. The semiconductor apparatus used in the process described above has a different chamber structure and electrode structure according to the characteristics required for each process. Because of these differences in structure, in-plane uniformity of the substrate temperature deteriorates due to heat radiation from the substrate placed in the chamber into the chamber atmosphere and heat radiation transferred from the substrate to the stage on which the substrate is placed. In addition, in an apparatus which has a plasma mechanism, the in-plane uniformity of the substrate temperature deteriorates due to the effects of the plasma density in the chamber.

In order to improve the deterioration of the in-plane uniformity of the substrate temperature, a technique for improving in-plane uniformity of the substrate temperature is disclosed in Japanese Laid Open Patent Publication No. 2006-24433 and Japanese Laid Open Patent Publication No. 2008-251707 for example in which a heating resistor body (heater part) arranged in a heater unit is divided into a plurality of zones and each heater part is independently controlled. In the heater units described in Japanese Laid Open Patent Publication No. 2006-24433 and Japanese Laid Open Patent Publication No. 2008-251707, since a recess part is arranged in a substrate between adjacent zones, the adjacent zones are thermally insulated.

However, as shown in Japanese Laid Open Patent Publication No. 2006-24433 and Japanese Laid Open Patent Publication No. 2008-251707, recess parts between adjacent zones are connected to a space in the chamber (or the atmosphere outside the chamber). Therefore, the insulation efficiency between adjacent zones is affected by the space temperature (or atmospheric temperature) in the chamber. As a result, the insulation efficiency between adjacent zones changes depending on the space temperature in the chamber (or atmospheric temperature), and therefore it is difficult to obtain a stable insulation effect which does not depend on the usage environment. In addition, if the distribution of the heated gas existing in the chamber is biased, in-plane uniformity of the substrate temperature deteriorates.

SUMMARY

A heater unit according to one embodiment of the invention includes a first heater part, a second heater part controlled independently of the first heater part, a base arranged with a groove in a region between the first heater part and the second heater part, and a cover part arranged at an opening end of the groove and providing a closed space with the groove.

In addition, the closed space may be a vacuum.

In addition, the closed space may be filled with a gas.

In addition, the closed space may be filled with a substance having a thermal conductivity lower than a thermal conductivity of the base.

In addition, an insulating layer covering the first heater part and the second heater part, and an electrostatic chuck attached to the base via the insulating layer may be further included.

In addition, a part of the insulating layer between the first heater part and the second heater part may be removed.

In addition, the groove may be arranged in a ring shape in a planar view of the base, and the cover part may be a ring shape

DESCRIPTION OF EMBODIMENTS

Figure 1:
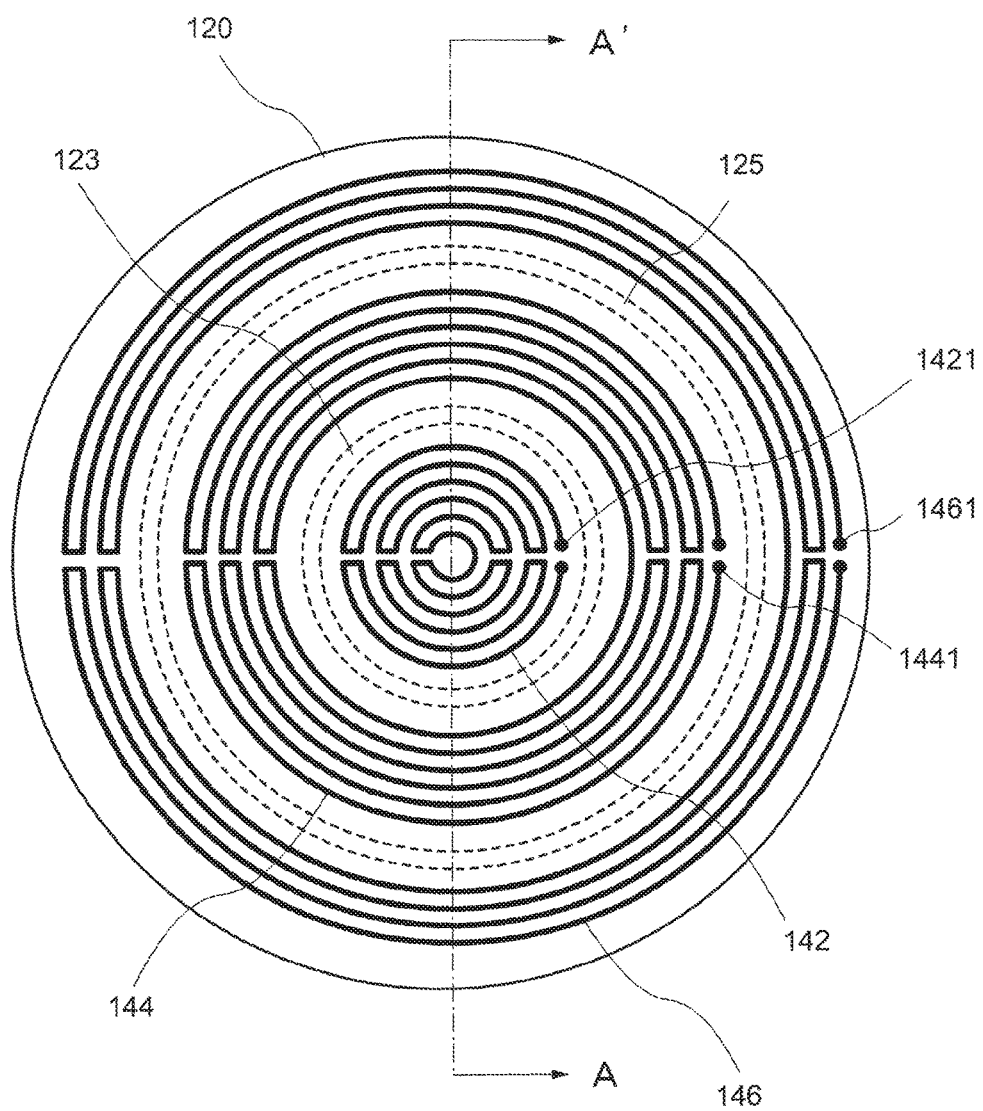
FIG. 1 is a top view showing the overall structure of a heater unit according to one embodiment of the present invention.

The heater unit according to one embodiment of the present invention is explained below while referring to the drawings. However, the heater unit of the present invention can be implemented in many different modes, and is not to be interpreted as being limited to the description of the embodiments described below. Furthermore, in the drawings referred to in the present embodiment, the same reference numerals are attached to the same parts or parts which have similar functions, and repeated explanation thereof is omitted. In addition, for the convenience of explanation, although an explanation is made using the terms "upper" or "lower", the directions upper or lower respectively indicate the direction at the time of using the heater unit (at the time of mounting the apparatus). In addition, although the drawings may be schematically represented in terms of the width, thickness, shape and the like of each part as compared with the actual mode in order to make the explanation clearer, they are only an example and should not limit the interpretation of the present invention.

One embodiment of the present invention has been made in view of such problems, and it is an object to provide a heater unit having high in-plane temperature uniformity.

<First Embodiment>

Figure 2:
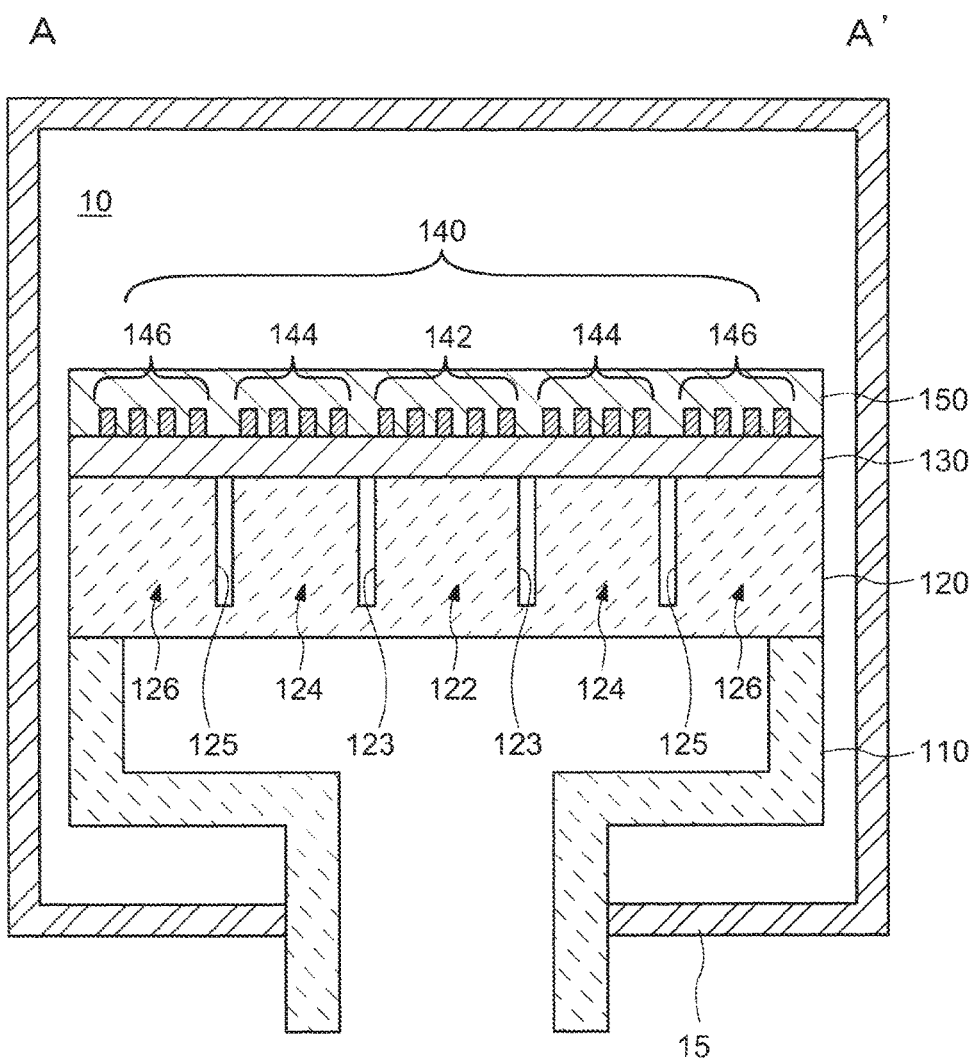
FIG. 2 is a cross-sectional view along the line A-A' in FIG. 1.

An overall structure of a heater unit according to a first embodiment of the present invention is explained using FIG. 1 and FIG. 2. The heater unit according to the first embodiment of the present invention has a heater unit which is divided into a plurality of zones and independently controlled. In addition, the heater unit according to the first embodiment can be used in a CVD apparatus, a sputtering apparatus, a vapor deposition apparatus, an etching apparatus, a plasma processing apparatus, a measurement apparatus, an inspection apparatus, a microscope, and the like. However, the heater unit according to the first embodiment is not limited to a unit used for use in the apparatuses described above and can be used for an apparatus which requires a substrate to be heated.

[Structure of Heater Unit 10]

FIG. 1 is a top view showing the overall structure of a heater unit according to one embodiment of the present invention. FIG. 2 is a cross-sectional view along the line A-A' in FIG. 1. As is shown in FIG. 1 and FIG. 2, the heater unit 10 according to the first embodiment includes a cover part 110, a base 120, a lid part 130, a heater part 140 and an insulating layer 150. The heater unit 140 includes a first heater unit 142, a second heater unit 144 and a third heater unit 146 which are independently controlled. Here, the first heater part 142, the second heater part 144 and the third heater part 146 are referred to as a heater part 140 unless otherwise distinguished. The base 120 has a first groove 123 and a second groove 125. The first groove 123 is provided between the first heater part 142 and the second heater part 144. The second groove 236 is provided between the second heater part 144 and the third heater part 146. The first heater part 142, the second heater part 144 and the third heater part 146 are connected to different heater controllers via external connection terminals 1421, 1441 and 1461 respectively.

As is shown in FIG. 2, the heater unit 10 is surrounded by a chamber 15. The chamber 15 is connected to the cover part 110 and separates a space in the chamber from the atmosphere outside the chamber. A part of the cover part 110 is arranged inside the chamber 15 and the other part of the cover part 110 is arranged outside the chamber 15. The cover part 110 has a hollow structure. The inside of the cover part 110 is exposed to the atmosphere. The outside of the cover part 110 is exposed to the space inside the chamber. The chamber 15 and the cover part 110 may be fixed together by welding or the like and may be detachably connected via a metal gasket or a resin O ring or the like.

The base 120 is arranged on the cover part 110. As described above, in the base 120, the first groove 123 is arranged in a region corresponding to the space between the first heater part 142 and the second heater part 144, and the second groove 125 is arranged in a region corresponding to the space between the second heater part 144 and the third heater part 146. The first groove 123 and the second groove 125 have open ends on the upper surface side (lid part 130 side of the base 120) of the base 120, and are recess parts having a bottom part on the lower surface side (cover part 110 side of the base 120) of the base 120. The depth of the first groove 123 and the second groove 125 with respect to the base 120 is 5 mm or more (thickness of the base 120 minus 5 mm or less) from the surface of the base 120. Here, it is also possible to say that the first groove 123 is arranged between a first zone 122 and a second zone 124 of the base 120, and the second groove 125 is arranged between the second zone 124 and a third zone 126.

The lid 130 is arranged on the base 120. That is, the lid part 130 is arranged on the open end side of the first groove 123 and the second groove 125. The lid part 130 has a flat plate shape and is arranged so as to close at least the open end of each of the first groove 123 and the second groove 125. That is, the lid part 130 forms a closed space together with the first groove 123 or the second groove 125. The lid part 130 is soldered to the base 120 via a solder material such as indium (In), tin (Sn) or an alloy containing these materials for example. These solder materials are arranged in a region on the upper surface of the base 120 except for the first groove 123 and the second groove 125. Here, in order to prevent the solder material from entering the inside of the first groove 123 and the second groove 125, the solder material may be provided on the upper surface of the base 120 with a sufficient offset with respect to the first groove 123 and the second groove 125.

An insulating layer 150 is arranged above the lid part 130. The heater part 140 is arranged between the lid part 130 and the insulating layer 150. That is, the heater part 140 is covered by the lid part 130 and the insulating layer 150. In other words, it can also be said that the heater part 140 is covered by the lid part 130 which has a flat upper surface, and the insulating layer 150 which is formed with a recess part on its lower surface.

Here, the inside of the first groove 123 and the inside of the second groove 125 are a vacuum or have a reduced pressure atmosphere. By making the inside of each groove a vacuum or a reduced pressure atmosphere, since it is difficult for heat exchange to occur between the first zone 122 and the second zone 124 of the base 120, and between the second zone 124 and the third zone 126 of the base 120, these zones efficiently insulated. In order to make the inside of the first groove 123 and the inside of the second groove 125 a vacuum or reduced pressure atmosphere, the lid part 130 may be arranged on the base 120 in a vacuum or reduced pressure atmosphere environment in the solder process described above.

In the above description, although the inside of the first groove 123 and the inside of the second groove 125 are exemplified as a vacuum or reduced pressure atmosphere, the present invention is not limited to this structure. For example, the inside of the first groove 123 and the inside of the second groove 125 may be filled with gas. Alternatively, the inside of the first groove 123 and the inside of the second groove 125 may be filled with a material (filler) having a thermal conductivity lower than that of the base 120. The material which is filled may be a solid such as a resin material or a liquid such as an oil. Even with these structures, since it is possible to make the first groove 123 and the second groove 125 more difficult to be influenced by the space temperature inside the chamber 15, it is possible to obtain a stable heat insulating effect which does not depend on the usage environment.

[Materials of Each Structural Component of Heater Unit 10]

A material such as aluminum (Al), titanium (Ti), stainless steel (SUS) and the like can be used as the cover part 110. A metal base or a semiconductor base can be used as the base 120. An Al base, Ti base, SUS base and the like can be used as the metal base. A silicon (Si) base, a silicon carbide (SiC) base or a gallium nitride (GaN) base and the like can be used as the semiconductor base. The thermal conductivity of the base 120 is preferably 100 W/mK or more. In the present embodiment, Al is used as the base 120.

Ti, SUS, silicon oxide ($SiO_2$), aluminum oxide ($Al_2O_3$), and the like can be used as the lid 130. A material having a thermal conductivity lower than that of the base 120 can be used for the lid part 130 and can be appropriately selected according to the thermal conductivity of the material used for the base 120. In addition, a material having a thermal conductivity lower than that of the insulating layer 150 can be used for the lid part 130 and can be appropriately selected according to a thermal conductivity of a material used for the insulating layer 150. In the present embodiment, SUS is used as the lid 130.

In the case when SUS is used as the lid 130, the thickness of SUS is preferably 1 mm or less in order to reduce the influence of heat exchange between different zones. Here, a material of the lid part 130 may have pores in order to realize the lid part 130 having a low thermal conductivity. In other words, the material of the lid 130 may be a porous material. In the case when a porous material is used as the lid 130, the lid 130 having a pore content of 1% or more and 20% or less can be used. Preferably, the pore content of the lid part 130 is 10% or more and 20% or less. Furthermore, in the case when a porous material is used as the lid 130, it is preferred to use a material that does not allow gas to permeate. However, a porous material that allows gas to permeate may be used as long as a vacuum or reduced pressure atmosphere can be maintained inside the first groove 123 and the second groove 125. Even in the case where gas or a filler is filled in the groove, a porous material that allows gas to permeate may be used as long as the filler can be maintained. Here, for example, in the case when porous SUS is used as the lid part 130, the thermal conductivity of the porous SUS is smaller than the bulk thermal conductivity of SUS (about 16.7 W/mK). Specifically, the thermal conductivity of the porous SUS is 2 W/mK or more and 16 W/mK or less. The thermal conductivity described above is a value when the thermal conductivity is measured by a laser flash method at 25° C.

A porous SUS can be formed by, for example, a cold spray method. Here, in order to solder the plate shaped lid 130 to the base 120, after forming a porous plate shaped SUS (lid 130) on a member which is different from the base 120, the lid 130 is soldered to base 120. The cold spray method is a method of forming a film by causing a material to collide with a base while in a solid phase state with a supersonic flow together with an inert gas without melting or gasifying the material. For example, in order to adjust the thickness of SUS, it is possible to obtain the lid part 130 by forming SUS by a cold spray method and then thinning it to a desired thickness by grinding. By forming the SUS by a cold spray method, it is possible to realize a porous SUS layer as mentioned above. By adjusting the formation conditions of the cold spray method, the content ratio of pores in the porous SUS layer can be adjusted. In addition, SUS may also be formed by a method other than the cold spray method.

In the above description, although the SUS was formed using a cold spray method to form a porous SUS, other methods such as plasma spraying, flame spraying, arc spraying, high velocity flame spraying (HVOF: High Velocity Oxygen Fuel, Or HVAF: High Velocity Air Fuel), a warm spray or the like my also be used to form the lid part 130. On the other hand, in the case of forming SUS having no pores or having a pore content ratio of 1% or less, sputtering, soldering, diffusion bonding or the like can be used.

A conductor that generates Joule heat by current can be used as the heater part 140. A refractory metal such as tungsten (W), tantalum (Ta), molybdenum (Mo), platinum (Pt) and the like can be used as the heater part 140. However, an alloy containing iron (Fe), chromium (Cr) and Al, an alloy containing nickel (Ni) and Cr, SiC, molybdenum silicide, carbon (C) and the like can also be used as the heater part 140 other than the refractory metal mentioned above. In the present embodiment, W is used as the heater part 140.

The insulating layer 150 is arranged to suppress the heater part 140 from being electrically connected to other members. That is, it is possible to use a material which provides the heater part 140 with sufficient insulation properties from other members as the insulating layer 150. $Al_2O_3$, aluminum nitride (AlN), $SiO_2$, silicon nitride (SiN) and the like can be used as the insulating layer 150. In the present embodiment, $Al_2O_3$ is used as the insulating layer 150.

As in the case of the heater unit 10 shown in FIG. 2, since the open end of the first groove 123 and the open end of the second groove 125 are covered by the lid 130, it is possible to prevent unintended parts in the manufacturing process from entering the inside of the first groove 123 and the second groove 125. For example, in the case when the heater part 140 and the insulating layer 150 are formed on the base 120, it is possible to prevent a part of the material of the heater part 140 and a part of the material of the insulating layer 150 from entering inside the first groove 123 and the second groove 125. In addition, it is possible to prevent a part of the adhesive which bonds the heater part 140 and the insulating layer 150 to the base 120 from being formed inside the first groove 123 and the second groove 125. If an unintended member is formed inside the first groove 123 and the second groove 125, the heat insulating efficiency between zones defined by the grooves arranged in the base deteriorates. However, with the structure of the heater unit 10, it is possible to suppress deterioration of heat insulating efficiency between zones. In addition, since a vacuum is uniformly maintained in the first groove 123 and the second groove 125 in the in-plane of the base 120 or a gas and filling material are filled, it is possible to reduce in-plane variation of the heat insulating performance between zones.

Although a structure in which the heater part 140 is sandwiched by the lid part 130 and the insulating layer 150 is exemplified in FIG. 2, the present invention is not limited to this structure. For example, the heater part 140 may be embedded in the insulating layer 150.

In addition, a structure in which the base 120 and the lid part 130 are in contact with each other is exemplified in FIG. 2, other layers may also be arranged between the base 120 and the lid part 130. In this case, a pattern may be formed in the other layer or a pattern may not be formed. Similarly, although a structure in which the lid part 130 and the insulating layer 150 are in contact with each other is exemplified in FIG. 2, other layers may also be arranged between the lid part 130 and the insulating layer 150.

As described above, with the heater unit 10 of the first embodiment, since a closed space is formed by the first groove 123 and the lid part 130, it is possible to obtain a high heat insulating effect between the first zone 122 and the second zone 124. Similarly, since a closed space is formed by the second groove 125 and the lid part 130, it is possible to obtain a high heat insulating effect between the second zone 124 and the third zone 126. The heat insulating effect obtained by the groove in which the closed space is formed does not depend on the usage environment. Therefore, since it is possible to increase the controllability of the temperature of each zone, it is possible to provide a heater unit which has high temperature in-plane uniformity or in which a temperature difference for each zone where the heater is installed can be intentionally set. As described above, since the heater unit 10 of the first embodiment can intentionally provide a temperature difference for each zone, it is possible to accurately control the temperature of each zone according to the usage environment.

In addition, since the closed space is a vacuum, a higher heat insulating effect between different zones can be obtained. In addition, even when the closed space is filled with a gas or a filler material, it is possible to obtain a higher heat insulating effect between different zones.

In the first embodiment, although a structure is exemplified in which the two grooves of the first groove 123 and the second groove 125 are arranged on the base 120 in order to separate the first zone 122, the second zone 124 and the third zone 126 corresponding to the three heater parts of the first heater part 142, the second heater part 144 and the third heater part 146, the present invention is not limited to this structure. The number of grooves arranged in the base 120 may be appropriately set according to the number of zones to be separated. In addition, although a structure is exemplified in which the first groove 123 and the second groove 125 are circular in a planar view, the present invention is not limited to this structure. The shapes of the first groove 123 and the second groove 125 can be designed according to the shape of each heater part. For example, the shapes of the first groove 123 and the second groove 125 may be rectangular or polygonal in addition to rectangular. In addition, although a structure is exemplified in which the second zone 124 surrounds the first zone 122 and the third zone 126 surrounds the first zone 122 and the second zone 124, the present invention is not limited to this structure. A plurality of zones may be divided into multiple shapes other than the above. For example, a plurality of zones may be zones obtained by dividing the base 120 into four, vertically and laterally with respect to the center of the base 120.

<Second Embodiment>

Figure 3:
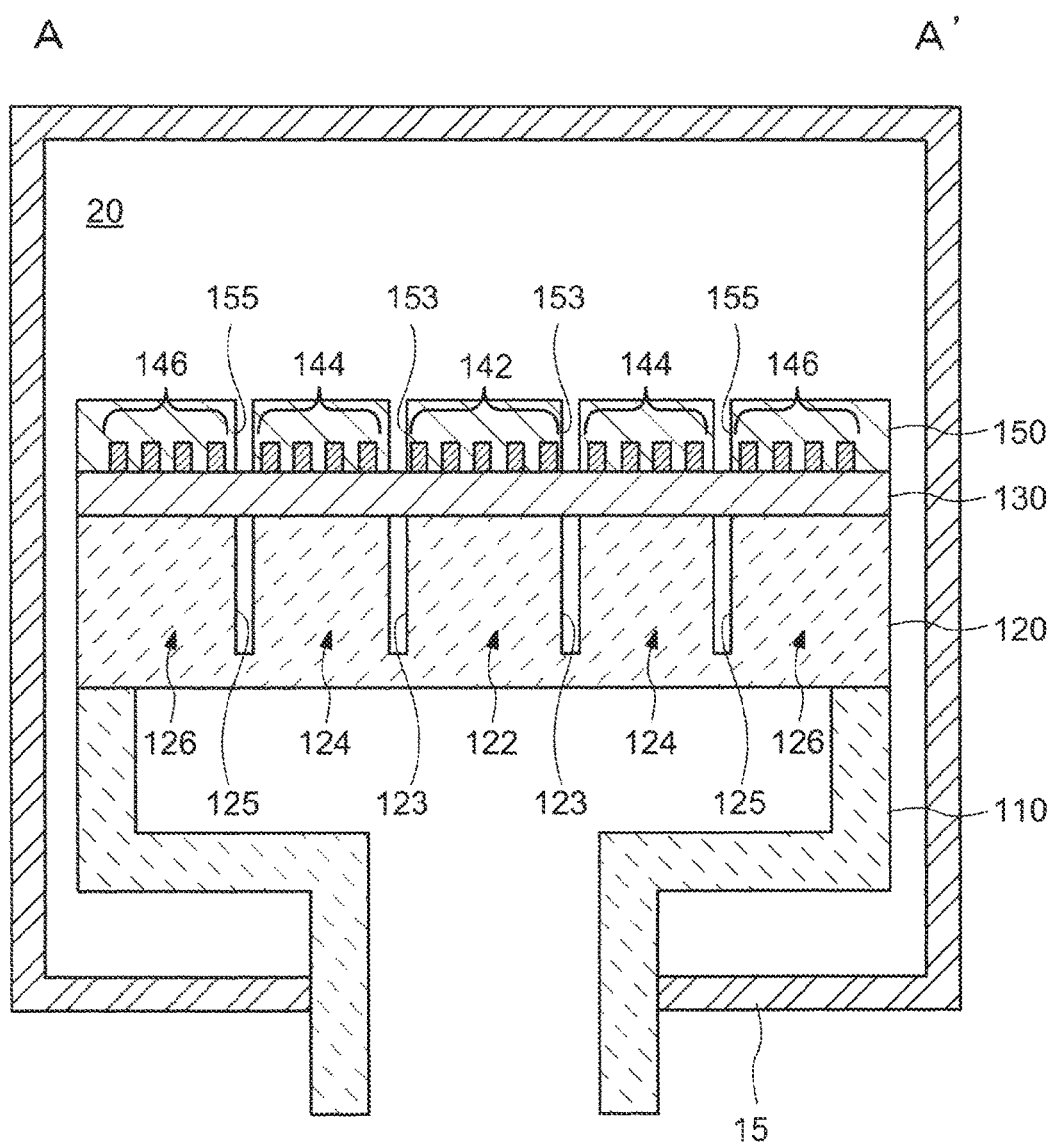
FIG. 3 is a cross-sectional view of a heater unit according to one embodiment of the present invention.

A cross-sectional structure of the heater unit according to the second embodiment of the present invention is explained using FIG. 3. The heater unit according to the second embodiment of the present invention has a heater part which is divided into a plurality of zones and independently controlled similar to the first embodiment. In addition, the heater unit according to the second embodiment can be used in a CVD apparatus, a sputtering apparatus, a vapor deposition apparatus, an etching apparatus, a plasma processing apparatus, a measurement apparatus, an inspection apparatus, a microscope and the like. However, the heater unit according to the second embodiment is not limited to that used in the apparatuses described above and can be used for any apparatus that requires a substrate to be heated.

[Structure of Heater Unit 20]

Since a top view of the heater unit 20 of the second embodiment is the same as that of the heater unit 10 of the first embodiment, an explanation thereof is omitted here. In addition, since the cross-sectional view of the heater unit 20 is similar to the cross-sectional view of the heater unit 10, in an explanation of the heater unit 20, an explanation of the same structure as that of the heater unit 10 is omitted and differences are mainly explained. Furthermore, the lid part 130 of the heater unit 20 is soldered to the base 120 via a solder material such as In, Sn and an alloy containing these materials for example.

FIG. 3 is a cross-sectional view of a heater unit according to one embodiment of the present invention. As is shown in FIG. 3, in the insulating layer 150 of the heater unit 20, a third groove 153 is arranged in a region corresponding to the first groove 123, and a fourth groove 155 is arranged in a region corresponding to the second groove 125 which is different from the heater unit 10. That is, in the heater unit 20, a third groove 153 is arranged between the insulating layer 150 covering the first heater part 142 and the insulating layer 150 covering the second heater part 144, and a fourth groove 155 is provided between the insulating layer 150 covering the second heater part 144 and the insulating layer 150 covering the third heater part 146.

In FIG. 3, the insulating layer 150 is completely removed in the thickness direction of the insulating layer 150 from regions in which the third groove 153 and the fourth groove 155 is provided, and the lid part 130 is exposed from regions in which the third groove 153 and the fourth groove 155 is provided. In addition, the third groove 153 is arranged in the same region as the first groove 123, and the fourth groove 155 is arranged in the same region as the second groove 125. That is, in a planar view, the first groove 123 and the third groove 153 overlap, and the second groove 125 and the fourth groove 155 overlap with each other.

As described above, with the heater unit 20 of the second embodiment, by arranging the third groove 153 in the insulating layer 150, it is difficult for the heat generated in the first heater part 142 to be transferred to the region of the second heater part 144. That is, it is possible to suppress interference between the first heater part 142 and the second heater part 144. Similarly, by arranging the fourth groove 155 in the insulating layer 150, it is possible to suppress interference between the second heater part 144 and the third heater part 146. As a result, since it is possible to increases the temperature controllability of each zone, it is possible to provide a heater unit having high in-plane temperature uniformity.

Furthermore, in the second embodiment, although a structure in which the insulating layer 150 is completely removed in the thickness direction of the insulating layer 150 in the third groove 153 and the fourth groove 155 is exemplified, the present invention is not limited to this structure. For example, only a part of the insulating layer 150 may be removed in the thickness direction of the insulating layer 150 in both or one of either of the third groove 153 and the fourth groove 155. That is, both or one of the third groove 153 and the fourth groove 155 may be a bottomed hole (a shape in which a part of the insulating layer remains in the bottom of the groove) arranged in the insulating layer 150.

In addition, although a structure in which the third groove 153 is arranged in the same region as the first groove 123 and the fourth groove 155 is arranged in the same region as the second groove 125 is exemplified in the second embodiment, the present invention is not limited to this structure. The third groove 153 may be arranged at least between the first heater part 142 and the second heater part 144, the fourth groove 155 may be arranged at least between the second heater part 144 and the third heater part 146, and it is not absolutely necessary that they are arranged in the same region as the first groove 123 and the second groove 125.

<Third Embodiment>

Figure 4:
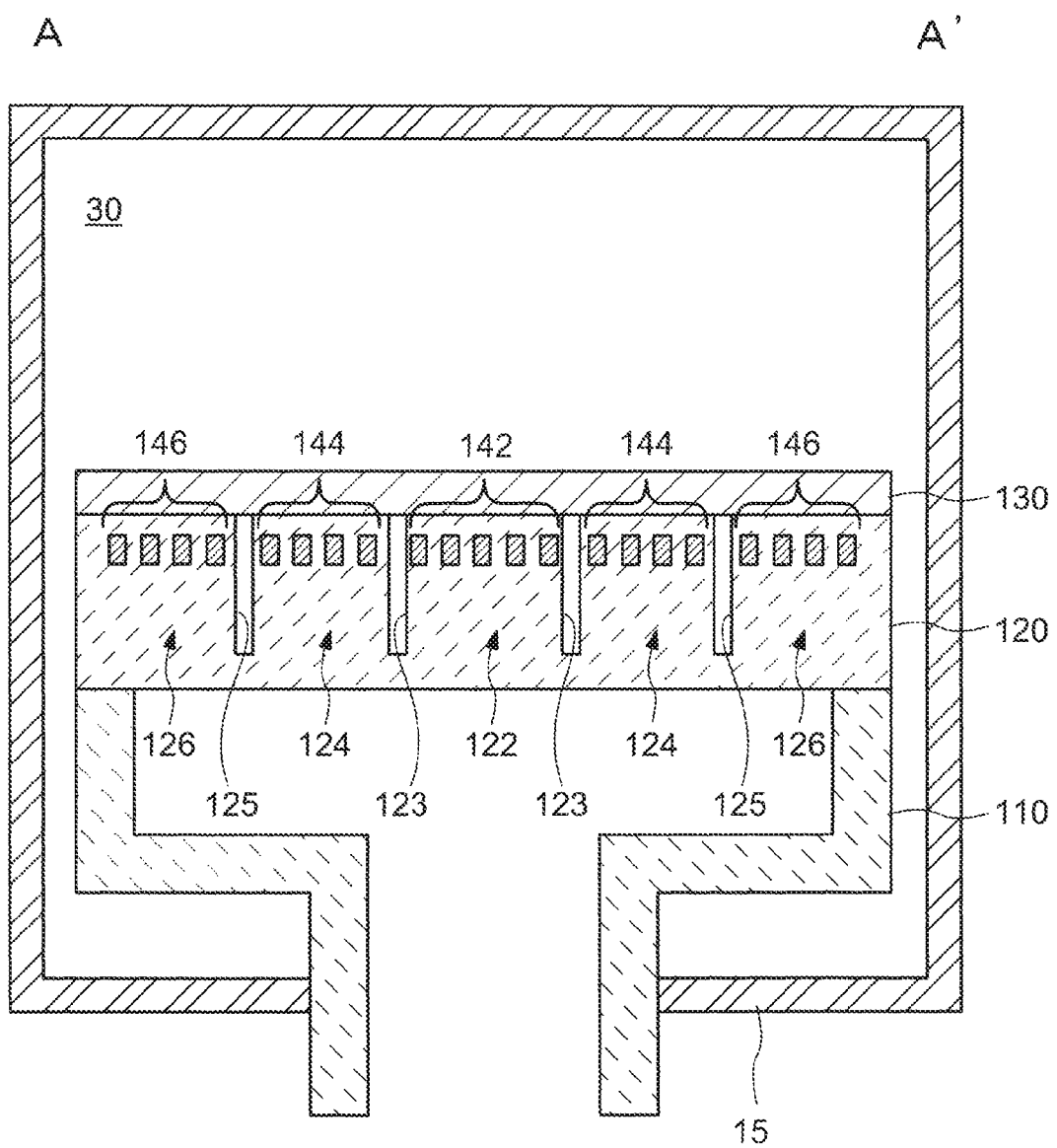
FIG. 4 is a cross-sectional view of a heater unit according to one embodiment of the present invention.

A cross-sectional structure of the heater unit according to the third embodiment of the present invention is explained using FIG. 4. The heater unit according to the third embodiment of the present invention has a heater part which is divided into a plurality of zones and independently controlled similar to the first embodiment. In addition, the heater unit according to the third embodiment can be used in a CVD apparatus, a sputtering apparatus, a vapor deposition apparatus, an etching apparatus, a plasma processing apparatus, a measurement apparatus, an inspection apparatus, a microscope and the like. However, the heater unit according to the third embodiment is not limited to that used in the apparatuses described above and can be used for any apparatus that requires a substrate to be heated.

[Structure of Heater Unit 30]

Since a top view of the heater unit 30 of the third embodiment is the same as that of the heater unit 10 of the first embodiment, an explanation thereof is omitted here. In addition, since the cross-sectional view of the heater unit 30 is similar to the cross-sectional view of the heater unit 10, in an explanation of the heater unit 30, an explanation of the same structure as that of the heater unit 10 is omitted and differences are mainly explained. Furthermore, the lid part 130 of the heater unit 30 is soldered to the base 120 via a solder material such as In, Sn and an alloy containing these materials for example.

FIG. 4 is a cross-sectional view of a heater unit according to one embodiment of the present invention. As is shown in FIG. 4, the heater unit 30 is different from the heater unit 10 in that the heater part 140 is embedded in the base 120. Specifically, in the heater unit 30, the first heater part 142 is embedded in the first zone 122 of the base 120, the second heater part 144 is embedded in the second zone 124 of the base 120 and the third heater part 146 is embedded in the third zone 126 of the base 120.

Although a structure in which the first heater part 142, the second heater part 144 and the third heater part 146 are embedded in the base 120 is exemplified in FIG. 4, the present invention is not limited to this structure. For example, the surface of each of the first heater part 142, the second heater part 144 and the third heater part 146 may be exposed from the base 120 and each heater part may be in contact with the lid part 130.

As described above, with the heater unit 30 of the third embodiment, since each of the first heater part 142, the second heater part 144 and the third heater part 146 are embedded in the base 120, and each groove forms a closed space between each of the heater parts, it is possible to obtain a high heat insulating effect between different zones. Since the heat insulating effect obtained by the groove in which the closed space described above is formed does not depend on the usage environment, it is possible to increase the temperature controllability of each zone. Therefore, it is possible to provide a heater unit which has high temperature in-plane uniformity or a unit in which a temperature difference for each zone where a heater is installed can be intentionally set.

<Fourth Embodiment>

Figure 5:
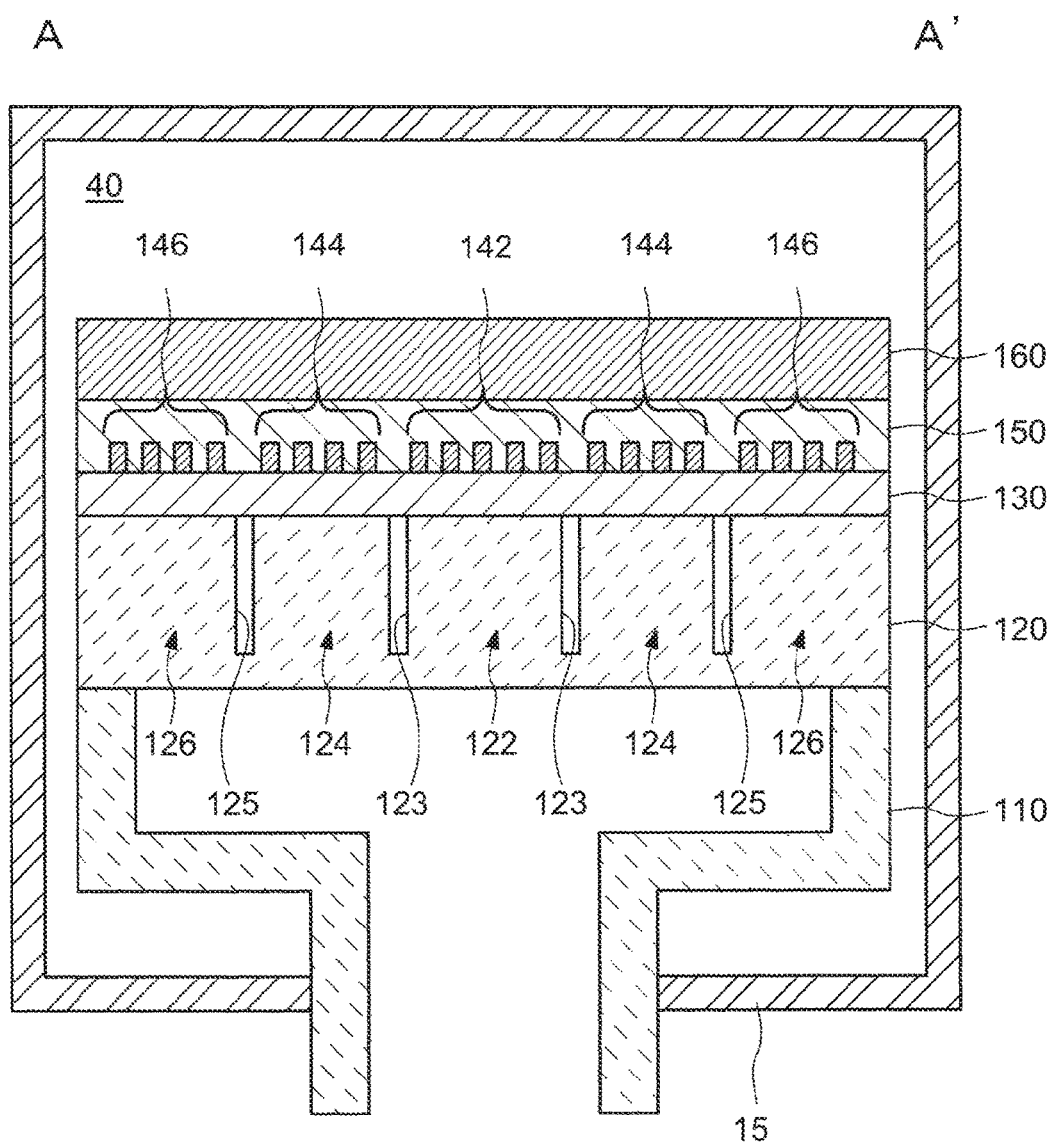
FIG. 5 is a cross-sectional view of a heater unit according to one embodiment of the present invention.

A cross-sectional structure of the heater unit according to the fourth embodiment of the present invention is explained using FIG. 5. The heater unit according to the fourth embodiment of the present invention has a heater part which is divided into a plurality of zones and independently controlled similar to the first embodiment. In addition, the heater unit according to the fourth embodiment can be used in a CVD apparatus, a sputtering apparatus, a vapor deposition apparatus, an etching apparatus, a plasma processing apparatus, a measurement apparatus, an inspection apparatus, a microscope and the like. However, the heater unit according to the fourth embodiment is not limited to that used in the apparatuses described above and can be used for any apparatus that requires a substrate to be heated.

[Structure of Heater Unit 40]

Since a top view of the heater unit 40 of the fourth embodiment is the same as that of the heater unit 10 of the first embodiment, an explanation thereof is omitted here. In addition, since the cross-sectional view of the heater unit 40 is similar to the cross-sectional view of the heater unit 10, in an explanation of the heater unit 40, an explanation of the same structure as that of the heater unit 10 is omitted and differences are mainly explained. Furthermore, the lid part 130 of the heater unit 40 is soldered to the base 120 via a solder material such as In, Sn and an alloy containing these materials for example.

FIG. 5 is a cross-sectional view of a heater unit according to one embodiment of the present invention. As is shown in FIG. 5, the heater unit 40 is different from the heater unit 10 in that it further includes an electrostatic chuck part 160 (ESC) on the insulating layer 150. Here, it can be said that the electrostatic chuck part 160 is attached to the base 120 via the insulating layer 150. The electrostatic chuck part 160 is adhered to the insulating layer 150 via an adhesive. The electrostatic chuck is a mechanism in which a dielectric layer is arranged on a stage, a voltage is applied between the stage and a processing substrate, and the processing substrate is attracted by a force generated between the dielectric layer and the processing substrate. Since the electrostatic chuck does not use a mechanical holding part, it is possible to uniformly form or process the entire surface of the processing substrate.

As described above, with the heater unit 40 of the fourth embodiment, the effects similar to those of the first embodiment can be obtained, and furthermore, it is possible to uniformly form or process the entire surface of the processing substrate. In addition, in the case when a processed substrate is held using a substrate holding mechanism such as a mechanical clamp, the heat of the processing substrate is transmitted to the mechanical clamp through a contact part between the mechanical clamp and the processing substrate. As a result, the temperature of the processing substrate in the vicinity of the contact part decreases, and the in-plane uniformity of the substrate temperature decreases. However, by holding the processing substrate using the electrostatic chuck, it is possible to suppress a decrease in the in-plane uniformity of the substrate temperature.

<Fifth Embodiment>

Figure 6:
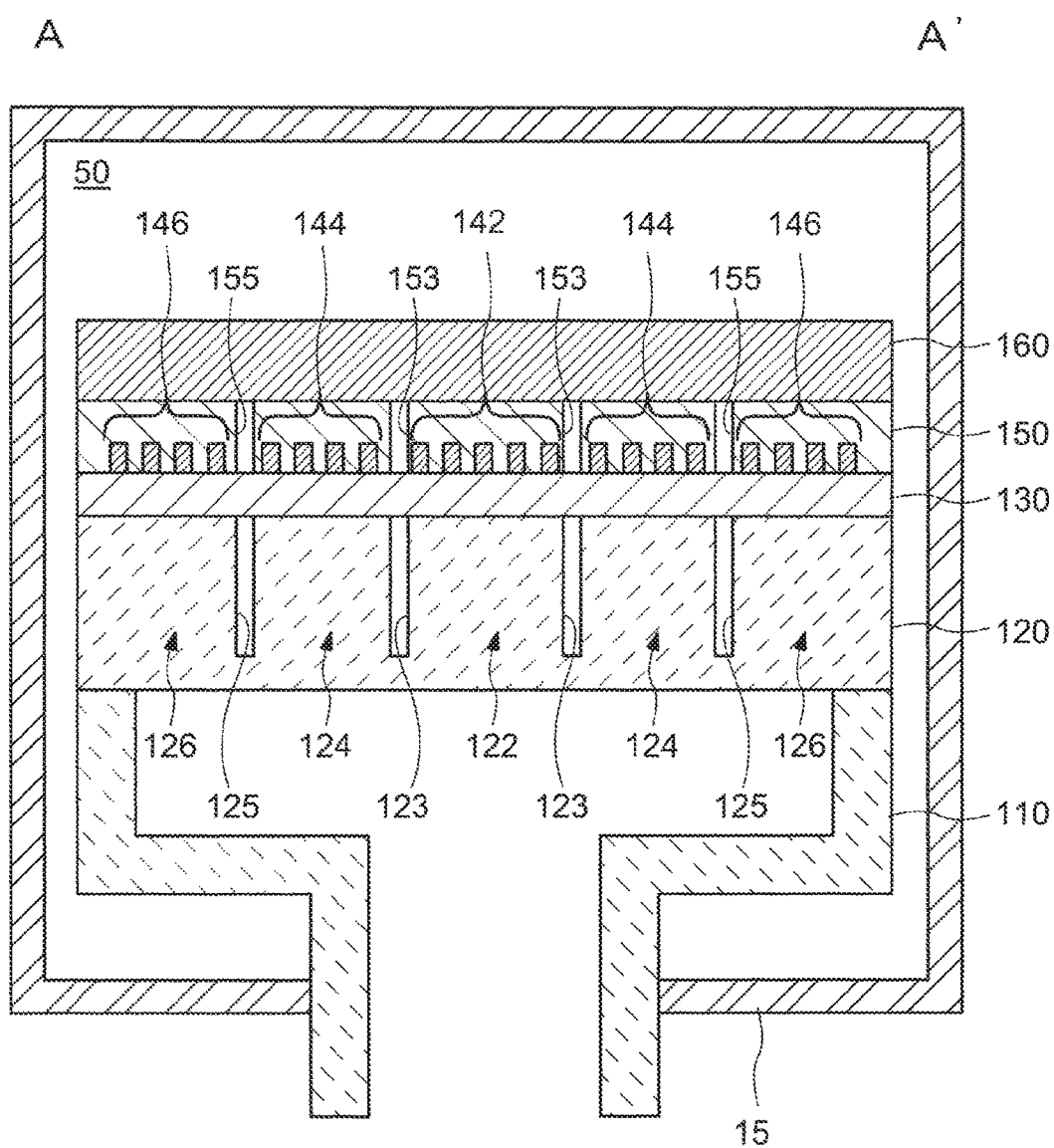
FIG. 6 is a cross-sectional view of a heater unit according to one embodiment of the present invention.

A cross-sectional structure of the heater unit according to the fifth embodiment of the present invention is explained using FIG. 6. The heater unit according to the fifth embodiment of the present invention has a heater part which is divided into a plurality of zones and independently controlled similar to the first embodiment. In addition, the heater unit according to the fifth embodiment can be used in a CVD apparatus, a sputtering apparatus, a vapor deposition apparatus, an etching apparatus, a plasma processing apparatus, a measurement apparatus, an inspection apparatus, a microscope and the like. However, the heater unit according to the fifth embodiment is not limited to that used in the apparatuses described above and can be used for any apparatus that requires a substrate to be heated.

[Structure of Heater Unit 50]

Since a top view of the heater unit 50 of the fifth embodiment is the same as that of the heater unit 10 of the first embodiment, an explanation thereof is omitted here. In addition, since the cross-sectional view of the heater unit 50 is similar to the cross-sectional view of the heater unit 10, in an explanation of the heater unit 50, an explanation of the same structure as that of the heater unit 10 is omitted and differences are mainly explained. Furthermore, the lid part 130 of the heater unit 50 is soldered to the base 120 via a solder material such as In, Sn and an alloy containing these materials for example.

FIG. 6 is a cross-sectional view of a heater unit according to one embodiment of the present invention. As is shown in FIG. 6, the heater unit 50 is different from the heater unit 20 in that it further includes an electrostatic chuck part 160 on the insulating layer 150 arranged with the third groove 153 and the fourth groove 155. The electrostatic chuck part 160 is adhered to the insulating layer 150 via an adhesive. In the heater unit 20, although the open ends of the third groove 153 and the fourth groove 155 are not closed and the space inside each groove is connected to the space of the chamber 15, in the heater unit 50, the third groove 153 and the fourth groove 155 form a closed space together with the electrostatic chuck part 160.

Here, the insides of the third groove 153 and the fourth groove 155 are a vacuum or have reduced pressure atmospheres. Since the inside of each groove is a vacuum or has a reduced pressure atmosphere, it is possible to suppress interference between the first heater part 142, the second heater part 144 and the third heater part 146. In addition, the insides of the third groove 153 and the fourth groove 155 may be filled with a gas or may be filled with a material (filler) having a lower thermal conductivity than the base 120.

As described above, with the heater unit 50 of the fifth embodiment, since the closed space is formed by the third groove 153 and the electrostatic chuck part 160, it is possible to suppress interference between the first heater part 142 and the second heater part 144. Similarly, since the closed space is formed by the fourth groove 155 and the electrostatic chuck part 160, it is possible to suppress interference between the second heater part 144 and the third heater part 146. As a result, it is possible to increase the temperature controllability of each zone. Therefore, it is possible to provide a heater unit which has high temperature in-plane uniformity or a unit in which a temperature difference for each zone where a heater is installed can be intentionally set. In addition, by holding the processing substrate using the electrostatic chuck, it is possible to suppress a decrease in in-plane uniformity of the substrate temperature.

<Sixth Embodiment>

Figure 7:
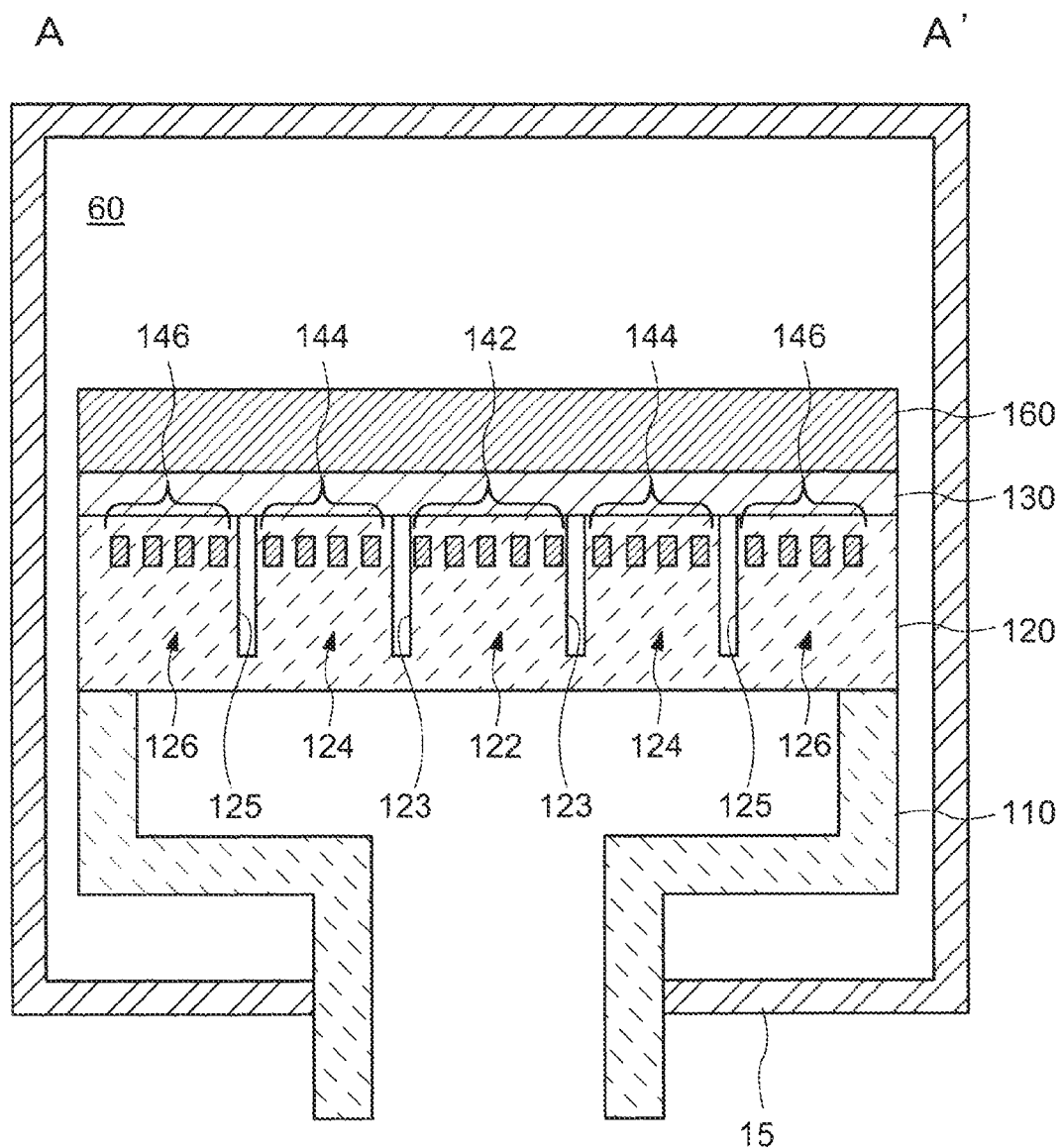
FIG. 7 is a cross-sectional view of a heater unit according to one embodiment of the present invention.

A cross-sectional structure of the heater unit according to the sixth embodiment of the present invention is explained using FIG. 7. The heater unit according to the sixth embodiment of the present invention has a heater part which is divided into a plurality of zones and independently controlled similar to the first embodiment. In addition, the heater unit according to the sixth embodiment can be used in a CVD apparatus, a sputtering apparatus, a vapor deposition apparatus, an etching apparatus, a plasma processing apparatus, a measurement apparatus, an inspection appara-tus, a microscope and the like. However, the heater unit according to the sixth embodiment is not limited to that used in the apparatuses described above and can be used for any apparatus that requires a substrate to be heated.

[Structure of Heater Unit 60]

Since a top view of the heater unit 60 of the sixth embodiment is the same as that of the heater unit 10 of the first embodiment, an explanation thereof is omitted here. In addition, since the cross-sectional view of the heater unit 60 is similar to the cross-sectional view of the heater unit 10, in an explanation of the heater unit 60, an explanation of the same structure as that of the heater unit 10 is omitted and differences are mainly explained. Furthermore, the lid part 130 of the heater unit 60 is soldered to the base 120 via a solder material such as In, Sn and an alloy containing these materials for example.

FIG. 7 is a cross-sectional view of a heater unit according to one embodiment of the present invention. As is shown in FIG. 7, the heater unit 60 is different from the heater unit 30 in that it further includes an electrostatic chuck part 160 on the lid part 130. The electrostatic chuck part 160 is adhered to the lid part 130 via an adhesive.

Here, in the case when the electrostatic chuck part 160 is attached directly to the base 120 arranged with the first groove 123 and the second groove 125, it is necessary to bond the base 120 and the electrostatic chuck part 160 with an adhesive. When the base 120 and the electrostatic chuck part 160 are directly bonded, a part of the adhesive enters the inside of the first groove 123 and the second groove 125. If the adhesive is formed inside the first groove 123 and the second groove 125, there is a problem whereby the heat insulating efficiency between the zones deteriorates.

With the structure of the heater unit 60, since the electrostatic chuck part 160 is bonded to the upper surface of the lid part 130 which closes the open ends of the first groove 123 and the second groove 125, it is possible to prevent the adhesive from entering the inside of the groove arranged in the substrate. In this way, it is possible to provide a heater unit that can suppress deterioration of heat insulating efficiency between zones, which has a high temperature in-plane uniformity or a unit in which a temperature difference for each zone where a heater is installed can be intentionally set.

<Seventh Embodiment>

Figure 8:
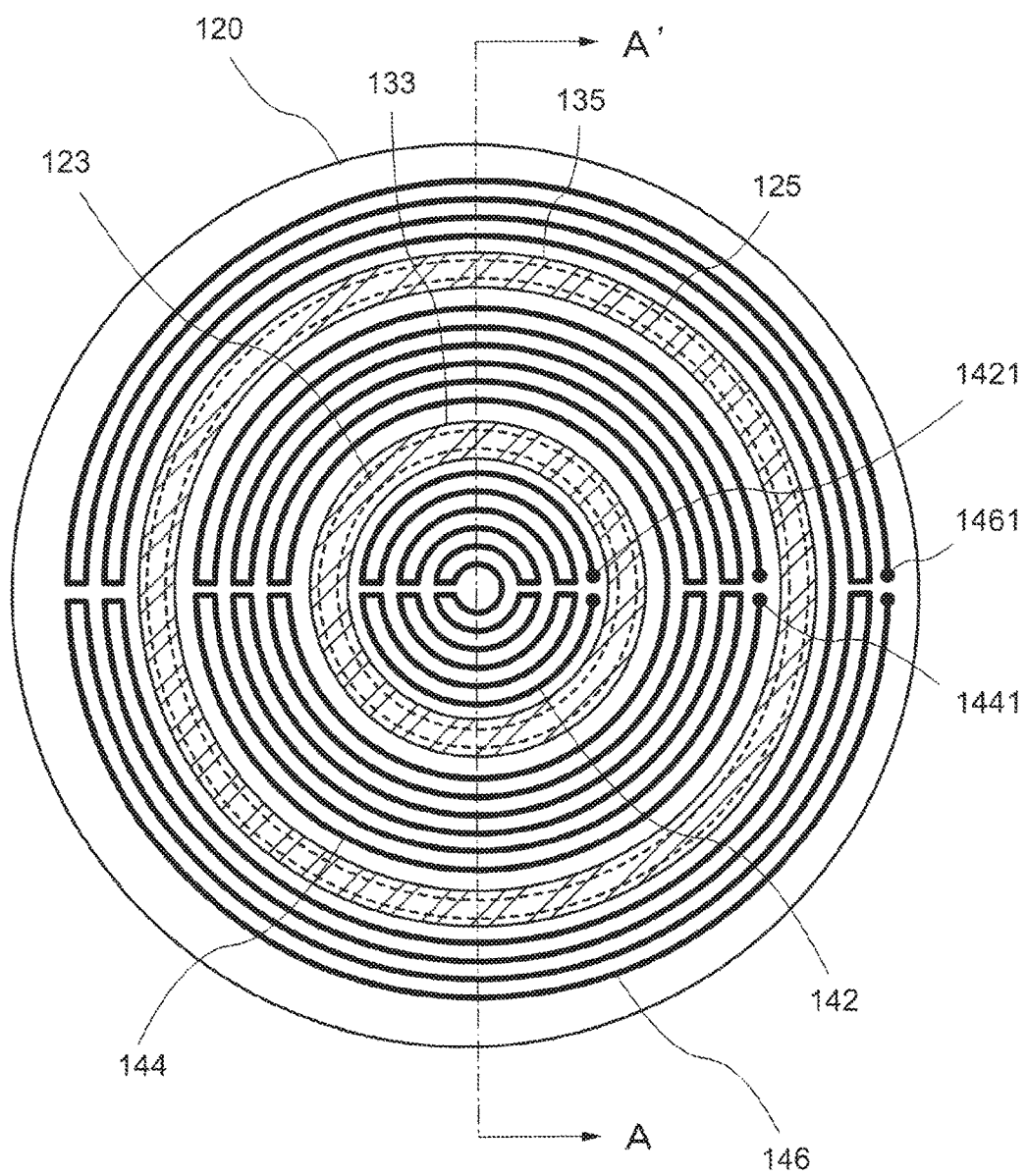
FIG. 8 is a top view showing the overall structure of a heater unit according to one embodiment of the present invention.
Figure 9:
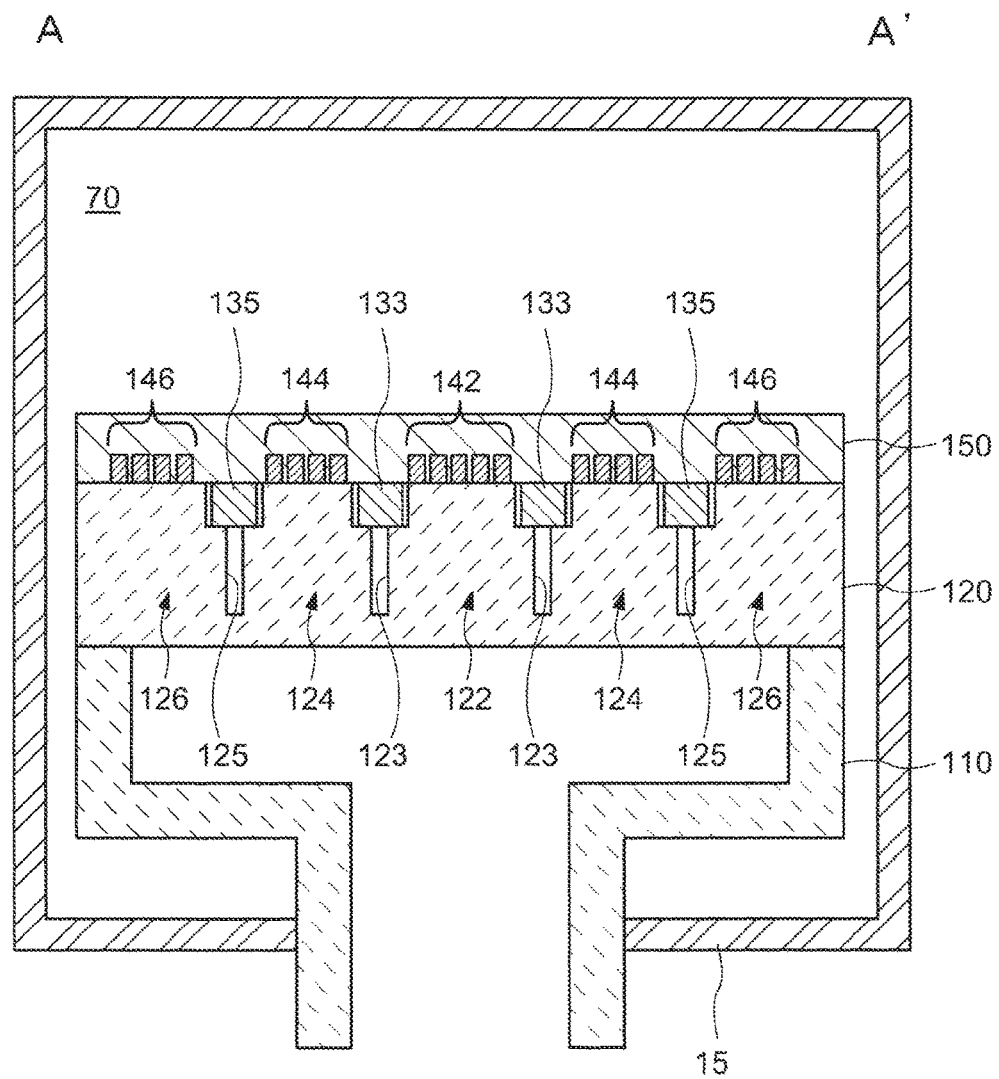
FIG. 9 is a cross-sectional view along the line A-A' in FIG. 8.

A cross-sectional structure of the heater unit according to the seventh embodiment of the present invention is explained using FIG. 8 and FIG. 9. The heater unit according to the seventh embodiment of the present invention has a heater part which is divided into a plurality of zones and independently controlled similar to the first embodiment. In addition, the heater unit according to the seventh embodiment can be used in a CVD apparatus, a sputtering apparatus, a vapor deposition apparatus, an etching apparatus, a plasma processing apparatus, a measurement apparatus, an inspection apparatus, a microscope and the like. However, the heater unit according to the seventh embodiment is not limited to that used in the apparatuses described above and can be used for any apparatus that requires a substrate to be heated.

[Structure of Heater Unit 70]

FIG. 8 is a top view showing an overall structure of a heater unit 70 according to one embodiment of the present invention. FIG. 9 is a cross-sectional view along the line A-A' in FIG. 8. In addition, since the heater unit 70 is similar to the heater unit 10 of the first embodiment, in an explanation of the heater unit 70, an explanation of the same structure as that of the heater unit 10 is omitted and differences are mainly explained.

As is shown in FIG. 8, the heater unit 70 includes a first lid part 133 arranged between the first heater part 142 and the second heater part 144, and a second lid part 135 arranged between the second heater part 144 and the third heater part 146. That is, in the heater unit 70, the first groove 123 and the second groove 125 are arranged in a ring shape in a planar view of the base 120. In addition, the first lid part 133 and the second lid part 135 are ring shaped. The first lid part 133 is arranged so as to overlap with the first groove 123 in a planar view. In addition, the second lid part 135 is arranged so as to overlap with the second groove 125 in a planar view. The seventh embodiment is an embodiment in which the lid part 130 of the first embodiment is replaced with the first lid part 133 and the second lid part 135 and the cross-sectional shapes of the first groove 123 and the second groove 125 are changed.

As is shown in FIG. 9, an opening width of the first groove 123 and the second groove 125 in the vicinity of the surface of the base 120 is larger than other parts, and the first lid part 133 and the second lid part 135 are arranged in a region where the opening width is large. Here, the opening width of the first groove 123 and the second groove 125 in the vicinity of the surface of the base 120 is larger than the widths of the first lid part 133 and the second lid part 135. In addition, the upper surface of the first lid part 133 and the upper surface of the second lid part 135 are substantially on the same plane with the upper surface of the base 120. The first lid part 133 and the second lid part 135 are soldered to the base 120 via a solder material such as In, Sn, and an alloy containing these materials for example. Here, the lower surface sides of the first lid part 133 and the second lid part 135 are soldered to the base 120. It is possible to use the same material as the lid part 130 for the first lid part 133 and the second lid part 135.

Furthermore, the upper surface of the first lid part 133 and the upper surface of the second lid part 135 may protrude further upward than the upper surface of the base 120 and conversely may be arranged further to the inner side of the base 120 than the upper surface of the base 120 (lower than the upper surface of the base 120). In addition, the first lid part 133 and the second lid part 135 may be soldered to the base 120 on the side surface of each lid part or both the lower surface and side surface of each lid part. In addition, as is shown in the fourth embodiment, the electrostatic chuck part may be arranged on the insulating layer 150.

As described above, according to the heater unit 70 of the seventh embodiment, not only it is possible to reduce material waste of a lid part which closes an opening end part of the first groove 123 and second groove 125, it is possible to easily align the first groove 123 and second groove 125 with respect to the base 120 and reduce the height of the heater unit 70.

Furthermore, the present invention is not limited to the embodiments described above and can be appropriately modified within a range that does not depart from the concept of the invention.

According to the heater unit of one embodiment of the present invention, it is possible to provide a heater unit having high in-plane temperature uniformity.

REFERENCE SIGNS LIST 10, 20, 30, 40, 50, 60, 70: heater unit, 15: chamber, 110: cover part, 120: base, 122: first zone, 123: first groove, 124: 125: second groove, 126: third zone, 130: lid part, 133: first lid part, 135: second lid part, 140: heater part, 142: first heater part, 144: second heater part, 146: third heater part, 150: insulating layer, 153: third groove, 155: fourth groove, 160: electrostatic chuck part, 1421, 1441, 1461: external connection terminal

What is claimed is:

1. A heat unit comprising:
a first heater part;
a second heater part controlled independently of the first heater part;
a base arranged with a groove in a region between the first heater part and the second heater part; and
a lid part arranged at an opening end of the groove and providing a closed space with the groove,
wherein the lid part is located between the first heater part and the base and between the second heater part and the base.

2. The heater unit according to claim 1, wherein the closed space is a vacuum.

3. The heater unit according to claim 1, wherein the closed space is filled with a gas.

4. The heater unit according to claim 1, wherein the closed space is filled with a substance having a thermal conductivity lower than a thermal conductivity of the base.

5. The heater according to claim 1, further comprising:
an insulating layer covering the first heater part and the second heater part.

6. The heater unit according to claim 5, wherein a part of the insulating layer between the first heater part and the second heater part is removed.

7. The heater according to claim 6, further comprising an electrostatic chuck attached to the base via the insulating layer.

8. The heater unit according to claim 1, wherein the groove is arranged in a line shape in a planar view.

9. The heater unit according to claim 1, wherein the groove is arranged in a ring shape in a planar view.

10. The heater unit according to claim 7, wherein the lid part is a ring shape in a planar view.

11. The heater unit according to claim 1, wherein
the base has a first surface and a second surface opposite side of the first surface, and
the groove has a bottom between the first surface and the second surface.

12. The heater unit according to claim 1, wherein
a region where the groove is located and a region where the first and second heater parts are located are divided from each other by the lid part.

* * * * *